(12) United States Patent
Ogino

(10) Patent No.: US 8,501,549 B2
(45) Date of Patent: Aug. 6, 2013

(54) METHOD OF MANUFACTURING A REVERSE BLOCKING INSULATED GATE BIPOLAR TRANSISTOR

(75) Inventor: Masaaki Ogino, Matsumoto (JP)

(73) Assignee: Fuji Electric Co., Ltd., Kawasaki (JP)

( * ) Notice: Subject to any disclaimer, the term of this patent is extended or adjusted under 35 U.S.C. 154(b) by 0 days.

(21) Appl. No.: 13/537,549

(22) Filed: Jun. 29, 2012

(65) Prior Publication Data

US 2013/0005093 A1  Jan. 3, 2013

(30) Foreign Application Priority Data

Jun. 30, 2011 (JP) ................. 2011-145492

(51) Int. Cl.
  *H01L 21/332* (2006.01)
(52) U.S. Cl.
  USPC ........................ 438/135; 438/136; 438/353
(58) Field of Classification Search
  USPC .............. 438/135, 136, 424, 353, 355, 356
  See application file for complete search history.

(56) References Cited

U.S. PATENT DOCUMENTS

| | | | |
|---|---|---|---|
| 4,904,609 A | 2/1990 | Temple | |
| 7,741,192 B2* | 6/2010 | Shimoyama et al. | 438/433 |
| 2005/0029568 A1 | 2/2005 | Tokuda et al. | |
| 2006/0038206 A1 | 2/2006 | Shimoyama et al. | |
| 2011/0006403 A1* | 1/2011 | Okumura et al. | 438/462 |
| 2011/0073903 A1* | 3/2011 | Yoshikawa et al. | 257/139 |
| 2012/0211768 A1* | 8/2012 | Yoshikawa | 257/77 |

FOREIGN PATENT DOCUMENTS

| | | |
|---|---|---|
| JP | 2-22869 | 1/1990 |
| JP | 2001-185727 | 7/2001 |
| JP | 2002-76017 | 3/2002 |
| JP | 2004-336008 | 11/2004 |
| JP | 2005-93972 | 4/2005 |
| JP | 2005-268487 | 9/2005 |
| JP | 2006-156926 | 6/2006 |
| JP | 2006-303410 | 11/2006 |
| JP | 2010-272647 | 12/2010 |
| JP | 2011-49337 | 3/2011 |

* cited by examiner

*Primary Examiner* — Kevin M Picardat

(57) ABSTRACT

A method of manufacturing a reverse blocking insulated gate bipolar transistor to form an isolation layer for bending and extending a pn junction, which exhibits a high reverse withstand voltage, to the front surface side. This ensures a high withstand voltage in the reversed direction and reduces leakage current in the reversely biased condition. Formation of a tapered groove by an anisotropic alkali etching process is conducted, resulting in a semiconductor substrate left with a thickness of at least 60 μm between one principal surface and the bottom surface of the tapered groove formed from the other principal surface.

7 Claims, 9 Drawing Sheets

GUARD RING

PHOTORESIST

PHOTORESIST

US 8,501,549 B2

METHOD OF MANUFACTURING A REVERSE BLOCKING INSULATED GATE BIPOLAR TRANSISTOR

CROSS-REFERENCE TO RELATED APPLICATIONS

This application claims the priority benefit of Japanese Patent Application No. 2011-145492, filed on Jun. 30, 2011, the disclosure of which is incorporated herein by reference.

BACKGROUND

1. Field

Embodiments of the present invention relate to a method of manufacturing a reverse blocking insulated gate bipolar transistor (hereinafter simply referred to as IGBT), and in particular to a method that provides an IGBT with the reliability of reverse blocking ability equivalent to the reliability of forward blocking ability, whereas only the latter reliability is generally secured in traditional IGBTs.

2. Description of the Related Art

A reverse blocking IGBT needs reverse blocking ability as reliable as the forward blocking ability of traditional IGBTs. In order to achieve high reliability of the reverse blocking ability, it is necessary to bend a reverse blocking pn junction in the back surface side, which is normally formed flat, around the side wall of the semiconductor chip substrate and extend the end portion of the pn junction from the back surface side to the front surface side of the chip substrate. The term 'isolation layer' in this specification means a diffusion layer forming the bent pn junction extending from the back surfaced side to the front surface side.

FIGS. 6A, 6B, and 6C are sectional views of the essential part of a semiconductor substrate showing solely a process of forming an isolation layer of a conventional reverse blocking IGBT. Fundamentally, this process for forming an isolation layer is a process of application and diffusion. A thick semiconductor substrate 1 with a diameter of six inches and a thickness of 625 µm is prepared. An oxide film 2 about 2.5 µm thick is formed on the substrate 1 for use as a dopant mask by thermal oxidation as shown in FIG. 6A. Then, an opening 3 is formed by patterning etching on the oxide film 2, for forming an isolation layer 4, as shown in FIG. 6B.

Then, boron source 5 is applied on the opening 3 and heat treatment is conducted in a diffusion furnace at a high temperature for a long time to form a p type isolation layer 4 with a depth of several hundred microns as shown in FIG. 6C. A reverse blocking IGBT for a breakdown voltage of 1,200 V class, for example, requires isolation layer 4 to have a depth of 200 µm. Forming an isolation layer 200 µm deep needs heat treatment at a high temperature of 1,300° C. for about 300 hr. A reverse blocking IGBT of 1,700 V class needs thermal diffusion process at the high temperature of 1,300° C. and a long thermal diffusion time of 600 hr. In order to utilize the isolation function of the isolation layer 4 at this stage, the wafer must be made thin by grinding from the back surface in a later step down to the position of the dotted line in FIG. 6C.

FIGS. 4A to 4E are sectional views of a semiconductor substrate showing a conventional method of manufacturing a reverse blocking IGBT. FIG. 4A is a sectional view of the semiconductor substrate at the stage of completion of the process for forming the isolation layer 4 described above. The region between the dotted lines 8 in FIG. 4E through the center of the isolation layer 4, formed from the front surface of the substrate, corresponds to one chip of a reverse blocking IGBT. A reverse blocking IGBT needs a MOS gate structure 10 formed on the front surface of the substrate as shown in FIG. 4B, which does not depict a detailed MOS gate structure because it is too precise to be illustrated in the figure. After that, the semiconductor substrate 1 is made thin by grinding from the back surface until the bottom of the isolation layer 4 is exposed as shown in FIG. 4C. FIGS. 4D and 4E show a back surface structure composed of a p collector layer 6 and a collector electrode 7 formed on this exposed isolation layer. The semiconductor substrate 1 is cut along the scribing lines 8 at the center of the isolation layer 4 shown in FIG. 4E to obtain reverse blocking IGBTs. FIG. 7 shows the cross section including the end region of the finished reverse blocking IGBT.

FIGS. 8A, 8B, and 8C are sectional views of an essential part of a reverse blocking IGBT showing a process for forming an isolation layer 4 in the sequence of process steps; the process is a conventional one but different from the one shown in FIGS. 6A, 6B, and 6C. In brief, this process forms an isolation layer 4 by digging a trench 11 vertically from the front surface of the semiconductor substrate 1 and forms a diffusion layer on the side wall surface of the trench. Specifically, a relatively thick oxide film 2 with a thickness of several microns is first formed on the substrate 1, as shown in FIG. 8A. After forming an opening through the oxide film 2, a trench 11 is formed to a depth of several hundred microns by anisotropic dry etching as shown in FIG. 8B. Then, the isolation layer 4, a diffusion layer, is formed by introducing impurities on the side wall surface of the trench 11 by means of a vapor phase diffusion process as shown in FIG. 8C. In FIG. 9, a MOS gate structure 10 is formed on the front surface and the trench 11 is filled with a reinforcing material such as polysilicon or an insulation film. After that, the semiconductor substrate is made thin by grinding from the back surface to a position close to the isolation layer 4. A back surface structure like the one shown in FIG. 4E is formed. The semiconductor substrate 1 is cut with a dicing process along scribe lines 8 into IGBT chips. Thus, a reverse blocking IGBT is obtained; FIG. 9 is an enlarged sectional view of the obtained IGBT showing the end region thereof.

Techniques to form an isolation layer on the side wall surface of a trench are disclosed in Patent Documents 1 through 3. In the manufacturing method disclosed in Patent Document 1, a deep vertical trench is formed surrounding the active device region of a semiconductor element from the upper surface of the device chip to a depth reaching a pn junction in the lower surface region. On the side wall surface of the trench, a p type diffusion layer, an isolation layer, is formed and connected to a p type diffusion layer in the lower surface region. Thus, the pn junction in the lower surface region of the device is bent and extended to the upper surface region with the isolation layer. Patent Documents 2 and 3, like Patent Document 1, also disclose a device exhibiting reverse blocking ability that has a trench formed from the upper surface of the device to reach a pn junction in the lower surface region and a diffusion layer is formed on the side wall surface of the trench.

The method shown in FIGS. 6A, 6B, and 6C depicts the formation of an isolation layer of a reverse blocking IGBT by means of an application and diffusion process. A boron source, which is a diffusion source of boron in a liquid state, is applied on the front surface and diffused by heating. In order to obtain an isolation layer with a diffusion depth of several hundred microns, the diffusion process must be conducted at a high temperature for a long time. In addition to the issues mentioned earlier, this causes inevitable problems of distortion of quartz jigs that lead to the construction of a diffusion furnace including a quartz boat, a quartz tube, and a quartz nozzle; contamination due to a heater; and decreased strength due to devitrification of the quartz jigs.

The application and diffusion process for forming an isolation layer must form a mask of oxide film. This mask of oxide film must be a thick and good quality oxide film to endure the boron diffusion process for a long time. Thermally oxidized films are used to obtain a mask of high durability, or a silicon oxide film of good quality. The thermal oxidation film must have a thickness of at least 2.5 µm to prevent boron atoms from penetrating through the mask oxide film during the diffusion process of boron used to form the isolation layer at a high temperature for a long time, for example, 1,300° C. for 200 hr. Forming a thermal oxidation film with a thickness of 2.5 µm requires an oxidation time of about 200 hr at an oxidation temperature of 1,150° C., for example, and in a dry oxygen atmosphere, which provides an oxide film of good quality.

A wet oxidation process or pyrogenic oxidation process may be employed to perform the oxidation in a shorter time than the dry oxidation process, although film quality is inferior to that of the dry process. The wet and pyrogenic processes still require an oxidation time of about 15 hr, which is not a satisfactorily short time. Moreover, these oxidation processes introduce a large amount of oxygen atoms into the silicon semiconductor substrate forming oxygen precipitation and lattice defects such as oxidation-induced stacking faults (OSFs) to create oxygen donors that deteriorate performance and degrade reliability of the device.

The thermal diffusion, after boron source application, is carried out at a high temperature for a long time usually in an oxygen atmosphere. This also introduces interstitial oxygen atoms into the semiconductor substrate causing oxygen precipitation, donor-creating phenomenon, and generation of lattice defects such as the OSFs and slip dislocations. These lattice defects are known to increase the leakage current at the pn junction in the semiconductor substrate and deteriorate breakdown voltage and reliability of insulation films created in the diffusion process on the semiconductor substrate. The oxygen donors lower the breakdown voltage.

Further, in the method of forming an isolation layer shown in FIGS. 6A, 6B, and 6C, the thermal diffusion of boron proceeds from the opening in the mask oxide film into the body of the silicon substrate in an isotropic way. Therefore, boron diffusion of 200 µm in the depth direction accompanies lateral diffusion of about 160 µm. This increases a device pitch and a chip size, which raises a chip cost.

In the method to form an isolation layer shown in FIGS. 8A, 8B, and 8C, a trench is formed by means of a dry etching process, and an isolation layer is formed by introducing boron into the side wall of the trench. The trench is then filled with a reinforcing material, such as an insulation film, and formed with a high aspect ratio. The method depicted in FIGS. 8A, 8B, and 8C is advantageous compared with the method depicted in FIGS. 6A, 6B, and 6C in terms of device pitch reduction because of smaller lateral expansion of the isolation layer in the method of FIGS. 8A, 8B, and 8C.

However, the etching process to a depth of about 200 µm requires a processing time of about 100 min for one sheet, using a typical dry etching apparatus, and thus results in inevitable drawbacks of prolonged lead time and increased maintenance frequency. When a deep trench is formed by a dry etching process using a mask of a silicon oxide film, a selection ratio is smaller than 50, which requires a silicon oxide film of several microns thick. This raises costs and lowers the rate of non-defective products caused by creation of process-induced lattice defects such as oxidation-induced stacking faults and oxygen precipitation.

In addition, the process of forming an isolation layer using a trench with a high aspect ratio, deeply dug by dry etching has technological problems that have not been completely eliminated. These problems concern the removal of residual chemical liquid and resist residues in the trench. Thus, this results in lowered yield and deteriorated reliability. Introduction of a dopant, such as phosphorus or boron into the side wall of a trench, is carried out by an ion injection process. This is usually done with the semiconductor substrate tilted because of vertical configuration of the trench side wall. However, the dopant introduction into the side wall of a trench with a high aspect ratio has drawbacks, including lowered effective dose, elongated injection time, decreased effective projection range, loss of dose due to screening oxidation film, and deteriorated injection uniformity. As an alternative to the ion injection, a vapor phase diffusion process may be employed for introducing impurities into a trench with a high aspect ratio. In the vapor phase diffusion process, the semiconductor substrate is exposed to a dopant atmosphere of vaporized phosphine $PH_3$, diborane $B_2H_6$, or the like. However, this process is inferior to the ion injection process in terms of precise control of dose amount.

The insulation film, filled into a trench with a high aspect ratio, can contain voids that cause problems of reliability. The manufacturing methods disclosed in Patent Documents 1, 2, and 3 require filling the trench with a reinforcing material to prevent the wafer from cracking before cutting the semiconductor substrate into semiconductor chips at scribe lines. This additional filling with a reinforcing material raises production costs.

Some means for solving the problems described thus far have been disclosed. For example, a tapered groove, in place of the perpendicular trench, can be formed with the side wall of the groove and tilted to a certain angle with respect to the principal surface of a substrate so that the surface area of an emitter side (or a collector side) is smaller than that of a collector side (or an emitter side). Chips with the tilted side wall of the tapered groove allow ion injection into the tilted side wall and annealing in the state of a wafer. Therefore, the problems mentioned above can be eliminated and isolation layers can be formed more easily.

In the method disclosed in Patent Documents 4 and 5, a tapered groove is formed by a selective anisotropic etching process in such a configuration that the side wall of the tapered groove is tilted so that the surface area in the emitter side is smaller than that in the collector side. In contrast, Patent Document 6 discloses a reverse blocking IGBT with a tapered side wall surface where the surface area is larger in the emitter side than in the collector side. The reverse blocking IGBT of Patent Document 6 utilizes a broader emitter side wall surface than the devices of Patent Documents 4 and 5. A broader area can be used for an n emitter region and a p base region that are formed in the surface region of the emitter side. Consequently, the current density is higher and the chip area is smaller for a given current rating. In the reverse blocking IGBT with a tapered groove, the isolation layer is formed by the processes of ion injection and annealing. This solves the above problems of lattice defects and oxygen-induced defects and damages on the furnace associated with the thermal diffusion for a long time. The aspect ratio is lower as compared with the manufacturing method to deeply dig a trench as shown in FIGS. 8A, 8B, and 8C. The process of forming the tapered groove does not have the problem of chemical liquid residue or resist residue. Introduction of dopant can be readily carried out into the tilted side wall surface by ion injection.

Patent Document 7 discloses a technique to enhance an activation rate by ion injection with the semiconductor substrate heated at temperatures in the range of 400° C. to 500° C.

[Patent Document 1]
    Japanese Unexamined Patent Application Publication No. H02-022869

[Patent Document 2]
    Japanese Unexamined Patent Application Publication No. 2001-185727

[Patent Document 3]
    Japanese Unexamined Patent Application Publication No. 2002-076017

[Patent Document 4]
    Japanese Unexamined Patent Application Publication No. 2006-156926

[Patent Document 5]
    Japanese Unexamined Patent Application Publication No. 2004-336008

[Patent Document 6]
    Japanese Unexamined Patent Application Publication No. 2006-303410

[Patent Document 7]
    Japanese Unexamined Patent Application Publication No. 2005-268487

A reverse blocking IGBT with a tapered groove, disclosed in Patent Documents 4, 5, and 6, has a thin (or shallow) isolation layer because it is formed by a method that does not use long time diffusion. As a consequence, lattice defects accompanying the ion injection process remain in the vicinity of a pn junction if the lattice defects are not fully cured by an annealing process. Thus, leakage current in reverse-biased condition is likely to become large, resulting in a lower reverse blocking voltage than the predetermined design value.

In the known annealing processes of laser annealing and activation annealing using a flash lamp, activation of the isolation layer may be insufficient. Lattice defects remain if accurate control is not performed on focusing position, which is the location necessary for proper activation of the isolation layer on the tapered groove during the lamp annealing process.

SUMMARY

Additional aspects and/or advantages will be set forth in part in the description which follows and, in part, will be apparent from the description, or may be learned by practice of the invention.

In view of the above-described issues, an object of present embodiments of the invention is to provide a method of manufacturing a reverse blocking insulated gate bipolar transistor (IGBT), namely a method to form an isolation layer for bending and extending the end portion of a pn junction, which has high reverse withstand voltage, to the front surface of the IGBT. The method of embodiments of the invention ensures high breakdown voltage in the reverse direction and reduces leakage current under reverse-biased condition.

To solve the above-described problems, a method of manufacturing a reverse-blocking insulated gate bipolar transistor is provided, the method comprising:

forming a ring-shaped diffusion layer of a second conductivity type composing a part of an isolation layer in a region of a first principal surface side of a semiconductor substrate of a first conductivity type;

forming a main front surface structure including a MOS gate structure region and a voltage withstanding structure region in a region surrounded by the ring-shaped diffusion layer of the first principal surface side region;

forming a tapered groove with a depth at least reaching a bottom surface of the ring-shaped diffusion layer from a second principal surface opposing the ring-shaped diffusion layer;

forming a second conductivity type region on a side wall surface of the tapered groove; and forming a collector layer of the second conductivity type on the second principal surface to connect the second principal surface to the first principal surface through the second conductivity region, wherein the tapered groove is formed by an anisotropic alkali etching process leaving the semiconductor substrate with a thickness of at least 60 μm between the bottom of the tapered groove and the first principal surface.

Preferably, the first principal surface is a (100) plane and the side wall surface of the tapered groove is a {111} plane.

Preferably, the method of embodiments of the present invention forms the main front surface structure by the following:

forming guard rings in the voltage withstanding structure region using a mask of an oxide film formed anew after forming the ring-shaped diffusion layer of the second conductivity type;

forming a polysilicon gate electrode to form the MOS gate structure inside the guard rings after processes of depositing a gate insulation film and a polysilicon film successively and removal of the polysilicon film on the second principal surface side; and depositing a metallic electrode interposing an interlayer dielectric film.

Preferably, the tapered groove is formed by the anisotropic alkali etching process using a mask of the oxide film that has been formed during the forming of the main front surface structure.

Preferably, to form the isolation layer, the second conductivity region is formed on the side wall surface of the tapered groove by an ion injection process, using the mask of the oxide film that has been used to form the tapered groove.

More preferably, a laser annealing process is conducted on the second conductivity region formed on the side wall surface of the tapered groove by the ion injection process, which activates the second conductivity region and obtains the completed isolation layer.

Preferably, the collector layer of the second conductivity type is formed on the second principal surface after completing the isolation layer and removing the mask of the oxide film.

BRIEF DESCRIPTION OF THE DRAWINGS

These and/or other aspects and advantages will become apparent and more readily appreciated from the following description of the embodiments, taken in conjunction with the accompanying drawings of which.

DESCRIPTION OF EMBODIMENTS

Figure 1A:
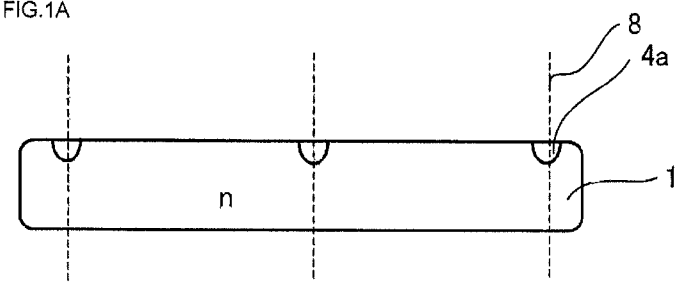
FIGS. 1A to 1E are sectional views of a semiconductor substrate, showing the initial five manufacturing procedures in the method of manufacturing a reverse blocking IGBT according to an embodiment of the invention.

Reference will now be made in detail to the embodiments, examples of which are illustrated in the accompanying drawings, wherein like reference numerals refer to the like elements throughout. The embodiments are described below to explain the present invention by referring to the figures.

In the following description, the first conductivity type is assigned to an n type and the second conductivity type is assigned to p type. The first principal surface is also referred to as an emitter-side wall surface or a front surface, and the second principal surface is also referred to as a collector-side surface or a back surface in the following description.

The following describes a method of manufacturing a reverse blocking IGBT of the invention while the processes similar to those in the conventional method are only described briefly.

First, in FIG. 1A, a floating zone (FZ) n type semiconductor substrate 1, whose principal surfaces are (100) planes, is prepared. On the front surface of the substrate 1, ring-shaped p$^+$ diffusion layers 4a for isolation layers are formed by boron ion injection around scribe lines 8 each becoming a periphery of a device chip.

Figure 1B:
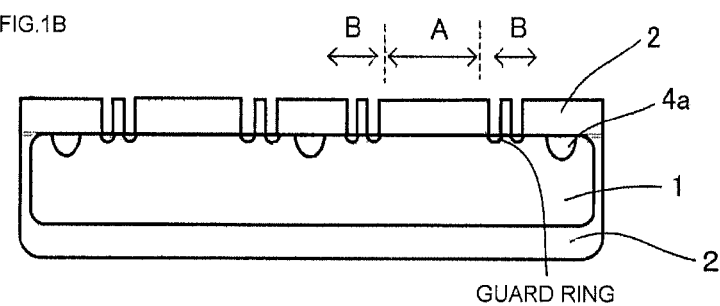

As shown in FIG. 1B, the ring-shaped p$^+$ diffusion layer 4a surrounds an active device function region A and a voltage-withstanding structure region B around the region A. A MOS gate structure is formed in the active region A and main current flows through the region A.

Guard ring diffusion layers are formed in the region B. A depth of the ring-shaped p$^+$ diffusion layer is deeper than the depth of the MOS gate structure and the depth of the guard-ring diffusion layers. The depth of the p$^+$ diffusion layer 4a can be 85 μm, for example. The ring-shaped p$^+$ diffusion layer 4a with a diffusion depth of 85 μm is formed by injecting boron ions using a mask of an oxide film or a photoresist mask followed by a driving diffusion process in an oxidation atmosphere at a temperature of about 1,300° C. and for a diffusion time of 50 hr.

Since the ring-shaped p$^+$ diffusion layer 4a is formed by a high temperature thermal diffusion process in an oxidation atmosphere, an oxide film is formed on the whole surface at the same time. This oxide film is initially removed, but is formed anew to a thickness of 0.5 to 1.5 μm. This oxide film is used as a mask of forming p type guard rings that are formed on the front surface region in the voltage-withstanding structure region B by ion injection as shown in FIG. 1B. The oxide film on the back surface of the substrate is protected with a photoresist to ensure that the oxide film remains unetched in the process of forming the mask of oxide film on the front surface. The oxide film on the back surface is to be used for a mask in the etching process of a tapered groove from the back surface side as described later. Whereas the protection of back surface is not always necessary when the etching in the process of forming the mask of oxide film on the front surface is carried out by a dry etching process, the back surface protection is essential when the etching is carried out by a wet etching process.

In the next procedure, a MOS gate structure is formed in the active region A for the IGBT function. Before the procedure, the oxide film on the active region A is patterned appropriately (not illustrated in the figures).

Figure 1C:
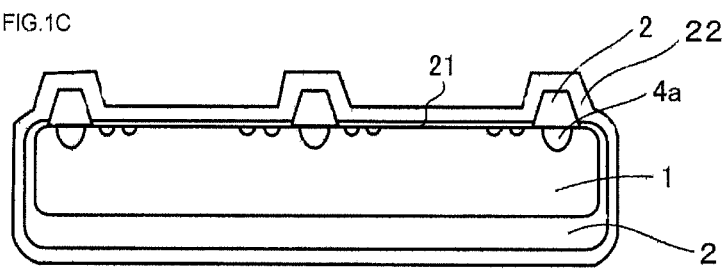

In FIG. 1C, after forming a gate oxide film 21, a polysilicon film 22 that becomes a gate electrode is formed by means of a reduced pressure CVD method (chemical vapor deposition method). A thickness of the polysilicon film 22 is preferably within the range of 400 to 800 nm. The formation of the polysilicon film 22 by the reduced pressure CVD method is conducted with the semiconductor substrate standing vertically on a jig in a furnace in a batch process. As a result, the polysilicon film 22 is deposited on the both surfaces of the semiconductor substrate as shown in FIG. 1C.

Figure 1D:
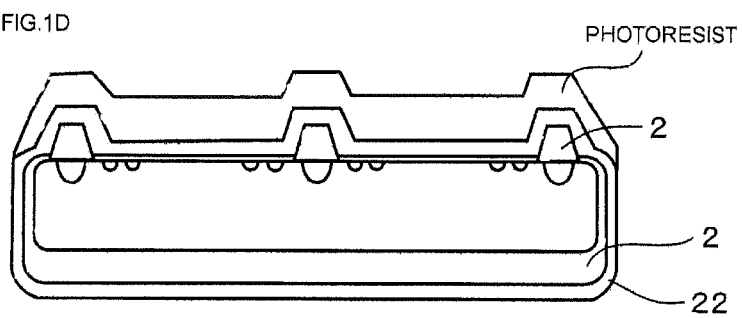

FIG. 1D depicts protecting the front surface with photoresist.

Figure 1E:
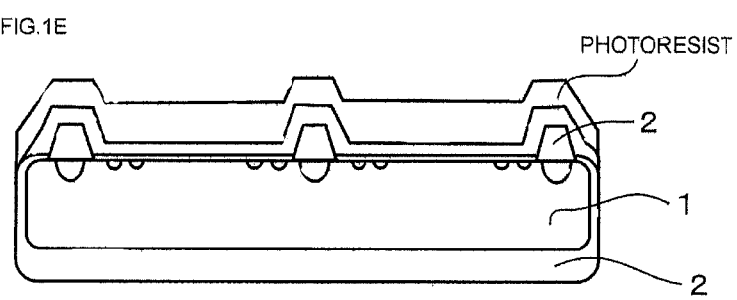

In FIG. 1E, the polysilicon film 22 on the back surface alone is removed by dry etching. This polysilicon film 22 can also be removed by a wet etching process.

Figure 2F:
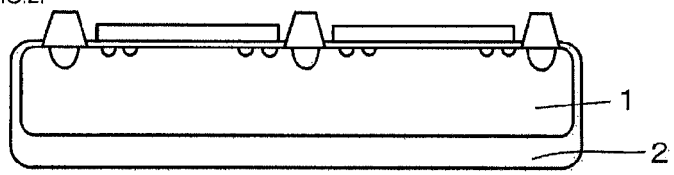
FIGS. 2F to 2J are sectional views of a semiconductor substrate, showing main manufacturing processes, following the procedures of FIGS. 1A to 1E, in the method of manufacturing a reverse blocking IGBT according to an embodiment of the invention.

In FIG. 2F, the polysilicon film 22 on the front surface is patterned to form a polysilicon gate electrode 22 after removing the polysilicon film 22 on the back surface. But, FIG. 2F does not illustrate a specific pattern because it is too fine to be depicted.

Figure 5A:
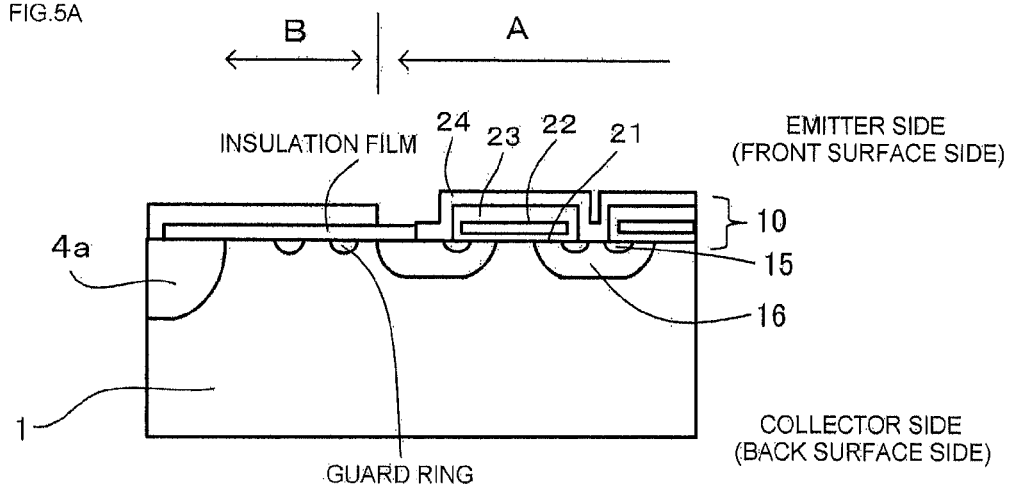
FIGS. 5A, 5B, and 5C are enlarged sectional views of a reverse blocking IGBT, showing a MOS gate structure in the front surface side of the substrate in the method of manufacturing a reverse blocking IGBT according to an embodiment of the present invention.

The specific structure near the gate electrode is described with reference to FIG. 5A which is an enlarged view of the chip substrate including the end region of the reverse blocking IGBT shown in FIG. 2F. On the surface of a p base region 16 disposed between an n emitter region 15 and the surface region of the n type semiconductor substrate 1, the polysilicon gate electrode 22 is formed intercalating a gate insulation film 21 to form a MOS gate structure 10.

After forming an interlayer dielectric film 23 over the polysilicon gate electrode 22, an emitter electrode 24 is formed commonly in contact with the surfaces of the p base region 16 and the surface of the n emitter region 15 to complete the surface MOS gate structure 10 of a reverse blocking IGBT. The emitter electrode 24 can be formed by depositing an aluminum-silicon alloy film, for example, by sputtering followed by heat treatment at a temperature of 400° C. to 500° C.

Figure 2G:
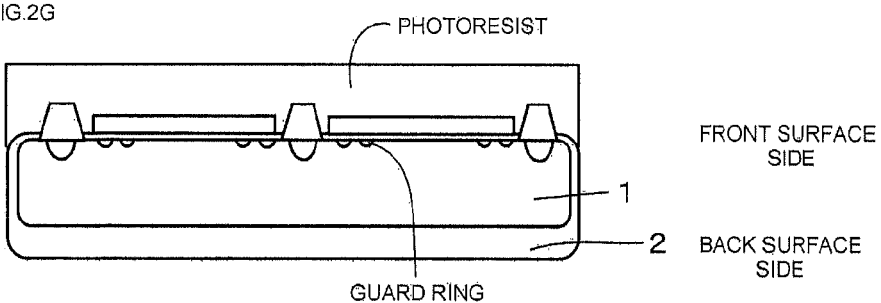
Figure 2H:
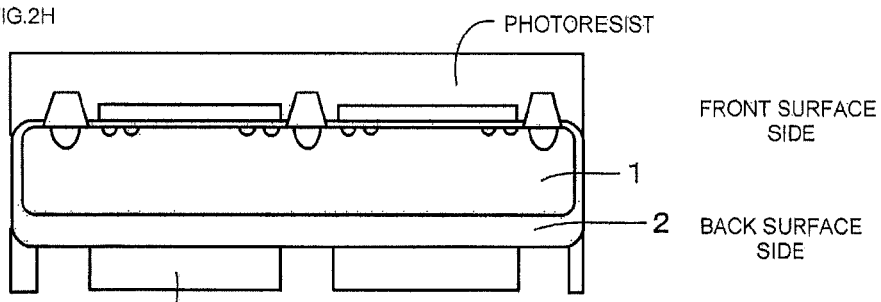
Figure 2I:
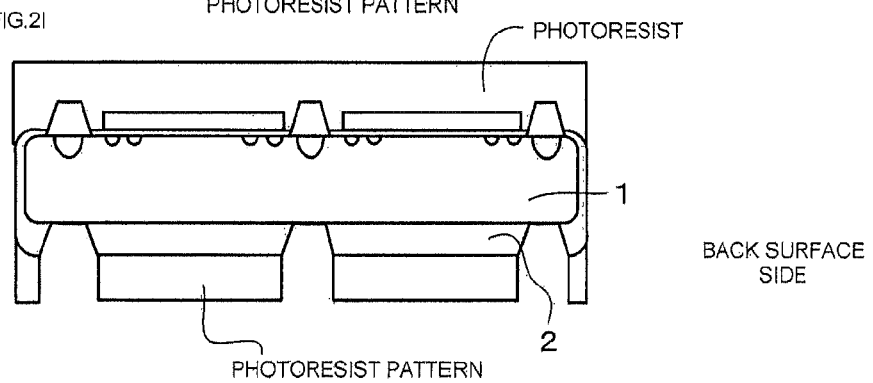
Figure 2J:
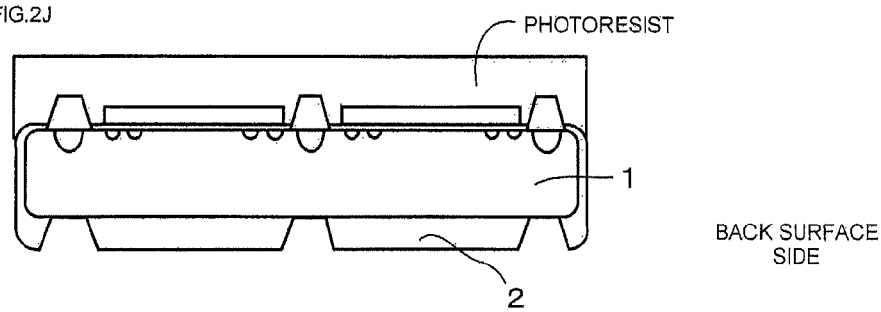

Next, FIGS. 2G to 2J show preparing processes conducted for etching the tapered grooves from the back surface of the FZ n type semiconductor substrate 1. In FIG. 2G, a protective film of photoresist is formed on whole the front surface. In FIG. 2H, a photoresist pattern for forming the tapered grooves is formed on the back surface. In FIG. 2I, the oxide film 2 on the back surface is patterned by etching using the photoresist pattern on the back surface. FIG. 2J shows the removal of the photoresist on the back surface.

The etching process for forming the tapered groove is performed by an anisotropic etching process using a known alkali etching solution for example, aqueous solution of KOH or 10% solution of tetramethylammonium hydroxide (TMAH). The etching process begins from an (100) plane of the back surface of the substrate at the openings in the mask of the oxide film 2. The etching proceeds on principal side wall surfaces of {111} planes toward the depth direction and stops at a depth where side wall surfaces of {111} planes intersect in a configuration of the letter V. The angle of this tilting side wall surface of {111} plane is 54.7 degrees with respect to the (100) plane of the principal surface of the substrate.

Figure 3K:
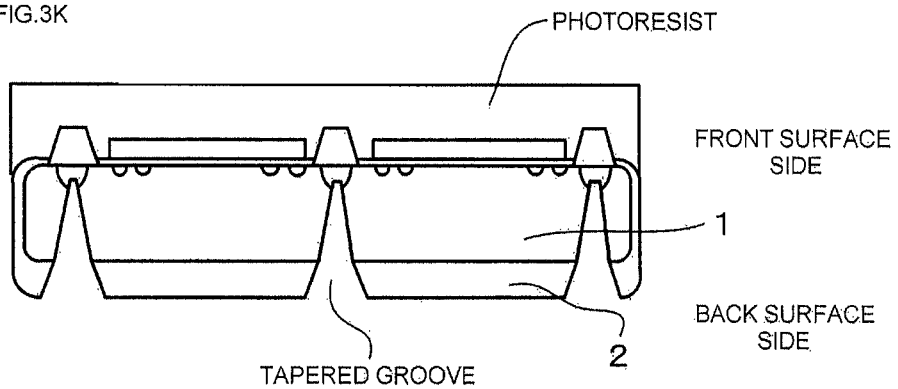
FIGS. 3K to 3N are sectional views of a semiconductor substrate, showing main manufacturing steps, following the procedures of FIGS. 2F to 2J, in the method of manufacturing a reverse blocking IGBT according to an embodiment of the invention.

FIG. 3K shows that the alkali etching process can be stopped before reaching the etching stopping configuration of the letter V to leave a desired bottom width of 100 to 150 µm by appropriately selecting a width of the opening in the mask of oxide film when using 10% TMAH solution at 85° C., for example.

Figure 5B:
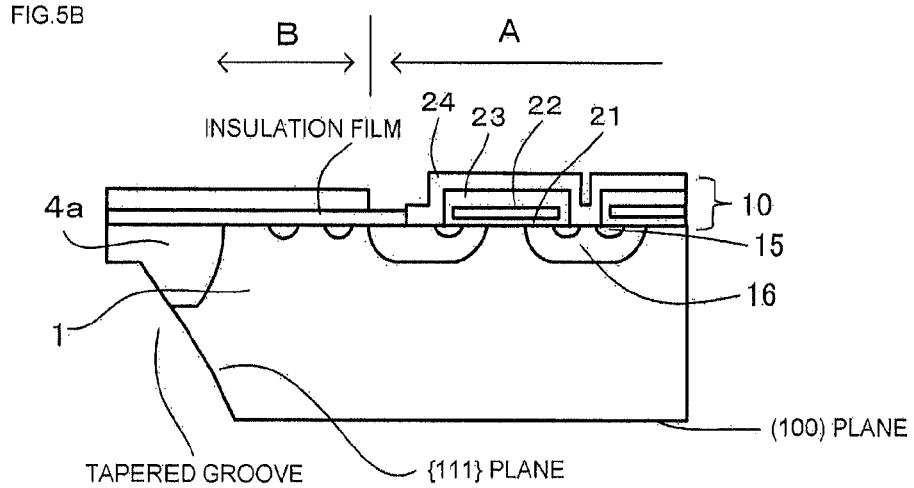

FIG. 5B is an enlarged sectional view of the chip substrate including the end portion of the reverse blocking IGBT of FIG. 3K and FIG. 5B. FIG. 5B shows the detailed structures of the device active region A and the withstand voltage structure region B in the front surface region surrounded by the ring-shaped p$^+$ diffusion layer 4a in the reverse blocking IGBT as well as the side wall surface of {111} plane, while those detailed structures are not shown in FIG. 3K.

Although this anisotropic etching process decreases the thickness of the semiconductor substrate at the place of the tapered groove, a certain thickness must be left between the bottom of the tapered groove and the front surface of the semiconductor substrate in order to ensure integrity of the semiconductor substrate including a multiple of device chips after completion of the etching process. Experiments by the inventor of the present invention showed that thicknesses of the left bottom of the tapered groove of less than 60 µm noticeably increased the cracks in the wafer of semiconductor substrate. Therefore, in a manufacturing method of embodiments of the present invention, it is necessary to leave a thickness of at least 60 µm at the bottom of the tapered groove. Thus, a reverse blocking IGBT of 3,300 V class can be manufactured with a tapered groove depth of 440 µm in a semiconductor substrate 500 µm thick.

A thickness of the ring-shaped p$^+$ diffusion layer 4a formed in the front surface side of the semiconductor substrate is necessarily at least 60 µm. The device will have more favorable productivity and performance when this ring-shaped p$^+$ diffusion layer 4a is shallower. Taking inaccuracy in the depths of the diffusion layer 4a and the tapered groove into account, the thickness between the bottom of the groove and the front surface is favorably at least 70 µm. From a practical point of view, it will be at least in the range of 85 to 100 µm.

Figure 3L:
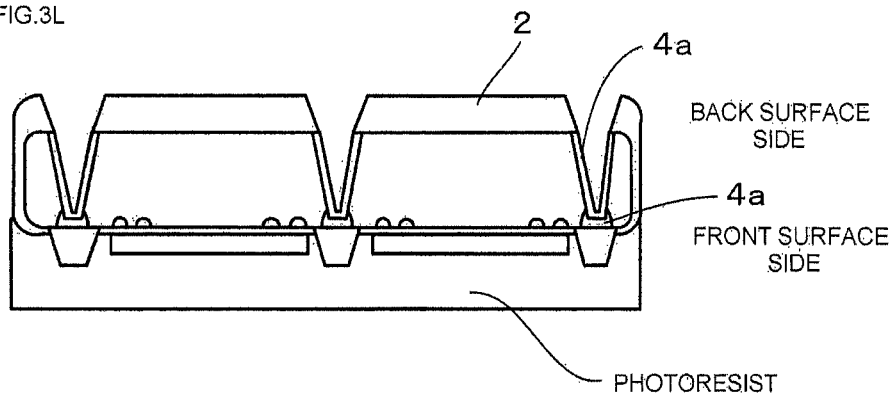

As shown in FIG. 3L, a boron ion injection process is conducted for forming a p region 4b as the main part of an isolation layer 4 on the tilted surface of the tapered groove from the back surface side of the substrate using a mask of the oxide film 2 that has been used for an etching mask in the process of forming the groove.

Although the temperature in the ion injection process can be a room temperature, when conducted at an elevated substrate temperature, it is preferably 400° C. at the highest in order to prevent the photoresist from difficulty in removal due to carbonization thereof. The ion injection is carried out under the conditions of a boron dose of $5\times10^{13}$ cm$^{-2}$ and an acceleration energy of 150 keV, followed by annealing processes of furnace annealing and laser annealing in this order or the reversed sequence. The condition of the laser annealing is irradiating energy density of 3 J/cm$^2$ of a YAG 2ω laser at a wavelength of 532 nm with a pulse width of 100 ns. The condition of the furnace annealing is a temperature in the range of 350° C. to 500° C. for 1 to 10 hr. The laser annealing is preferably conducted in a selective scanning irradiation mode, in which irradiating places are controlled using a mask or shutter of stainless steel.

The furnace annealing process is carried out using an electric furnace kept at a constant temperature between 350° C. and 500° C. Temperatures in this range are effective to activate the ion-injected layer but do not adversely affect the surface structures in the emitter side that have been formed in the earlier processes including the n emitter region 15, p base region 16, gate insulation film 21, gate electrode 22, and emitter electrode 24.

Figure 3M:
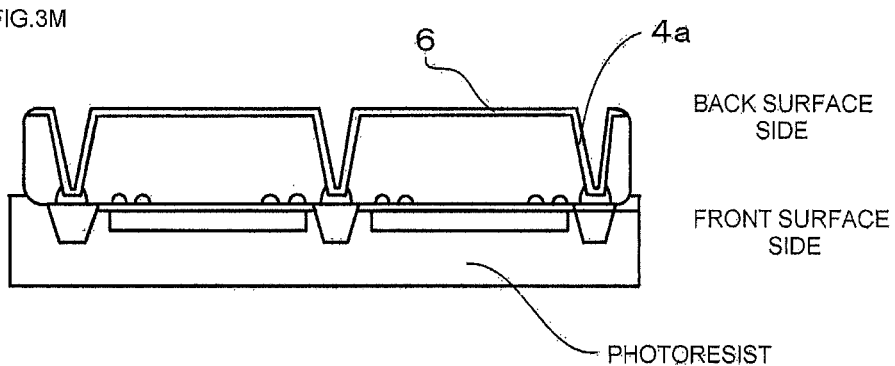

Then, as shown in FIG. 3M, a p collector layer 6 is formed after removing the oxide film 2 on the back surface. This is done by boron ion injection in a similar process as the one used for forming the p region 4b of the isolation layer 4, including the followed annealing process.

The conditions for the boron ion injection are an acceleration energy of 100 keV and a dose amount of $5\times10^{13}$ cm$^{-2}$, for example. The ion injection processes for forming the p collector layer 6 and p region 4b of isolation layer 4 are conducted separately because they can be carried out under different conditions.

When formed simultaneously, the p region 4b of the isolation layer 4 and the collector layer 6 are favorably formed as deep as possible in order to suppress leakage current through defective places in the back surface side. However, such a deep region decreases the impurity concentration in the front surface side region of the semiconductor substrate. In addition, the impurity concentration in the front surface side region must be enhanced to obtain good ohmic contact with a metallic electrode.

In order to meet both the requirements, the ion injection is preferably carried out in separate instances. For example, a deep p region is formed under the conditions of an acceleration energy of 150 keV and a dose of in the range of $5\times10^{12}$ to $5\times10^{14}$ cm$^{-2}$, and a shallow p region is formed under the conditions of an acceleration energy of 45 keV and a dose in the range of $1\times10^{13}$ to $1\times10^{15}$ cm$^{-2}$. Separate ion injection procedures allow a region 4b of an isolation layer to be formed with a predetermined depth and impurity concentration and a p collector layer 6 to be formed with a different predetermined depth and impurity concentration. Thus, the p region 4b of the isolation layer 4 and the collector layer 6 can be fabricated with the depth and impurity concentration desired for respective layers.

The ion injection process can be performed at one time if they share common conditions. The photoresist on the surface side of the substrate can be removed if allowable.

Figure 3N:
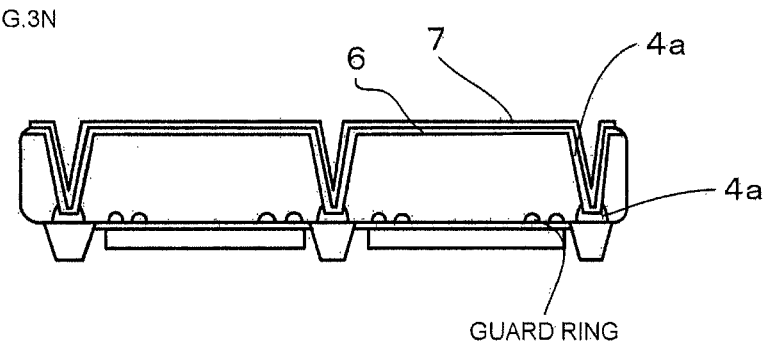
Figure 4A:
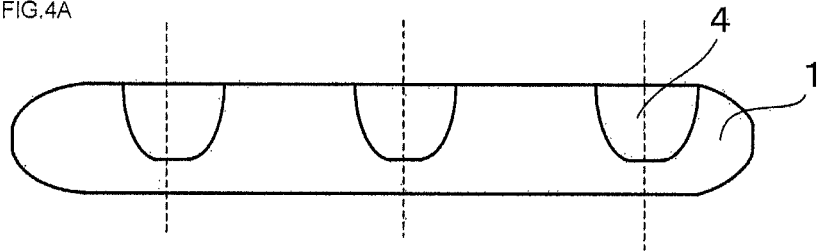
FIGS. 4A to 4E are sectional views of a semiconductor substrate, showing main manufacturing procedures in the method of manufacturing a reverse blocking IGBT according to a traditional technology.
Figure 4B:
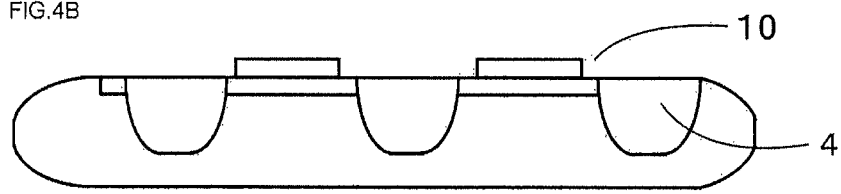
Figure 4C:
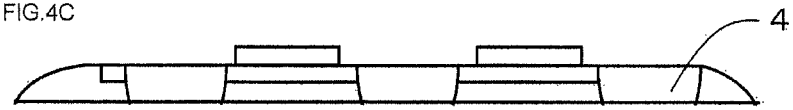
Figure 4D:
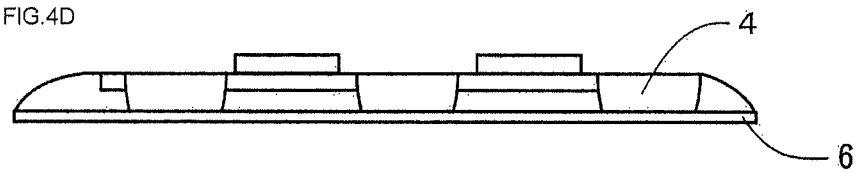
Figure 4E:
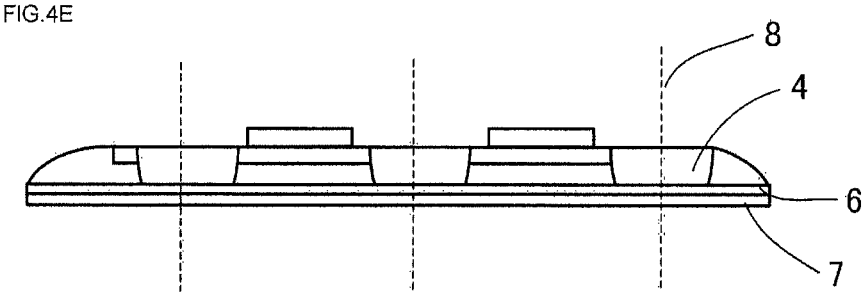

Following, as shown in FIG. 3N, laser annealing is conducted on the collector layer 6. The photoresist on the front surface side of the substrate is removed and a collector electrode 7 is formed on the collector layer 6 by depositing a sputtered metallic film composed of laminated layers of, for example, Al/Ti/Ni/Au. After cutting the substrate along the line at the center of the tapered groove, a reverse blocking IGBT chip is obtained.

Figure 5C:
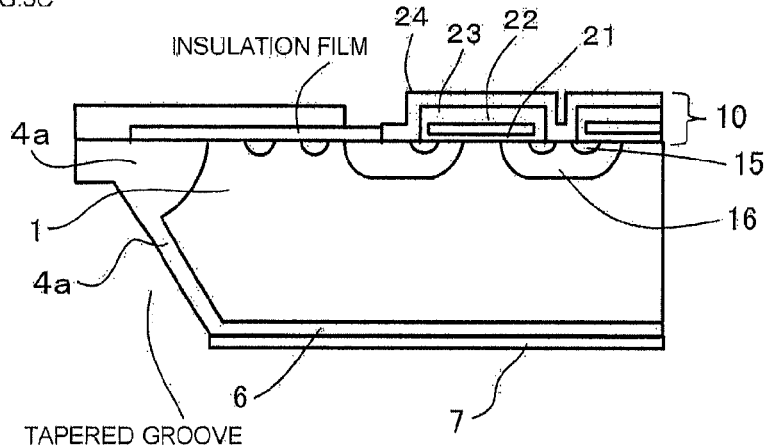
Figure 6A:
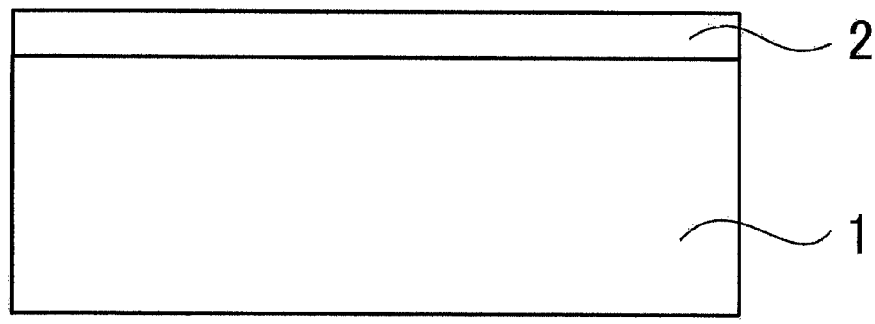
FIGS. 6A, 6B, and 6C are enlarged sectional views of the part around the isolation layer, showing a conventional process for forming the isolation layer.
Figure 6B:
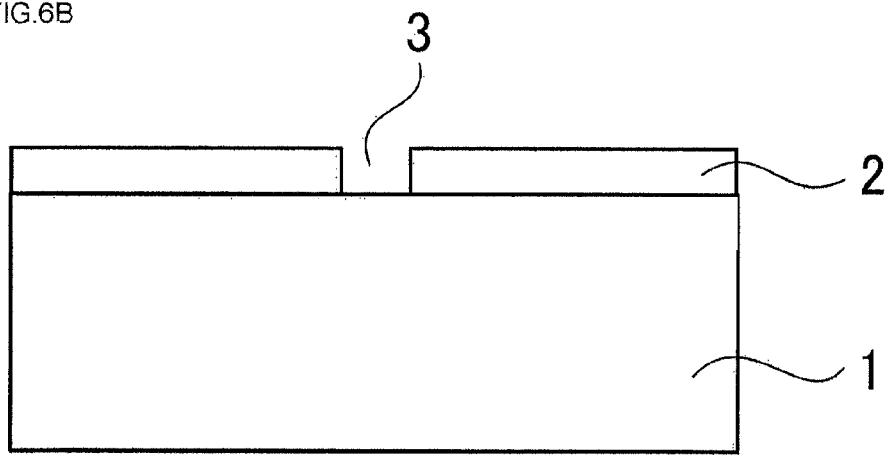
Figure 6C:
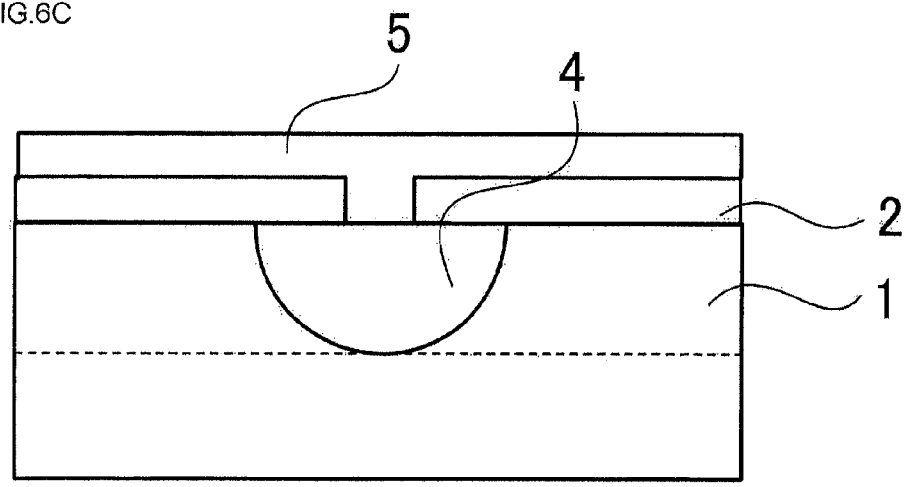
Figure 7:
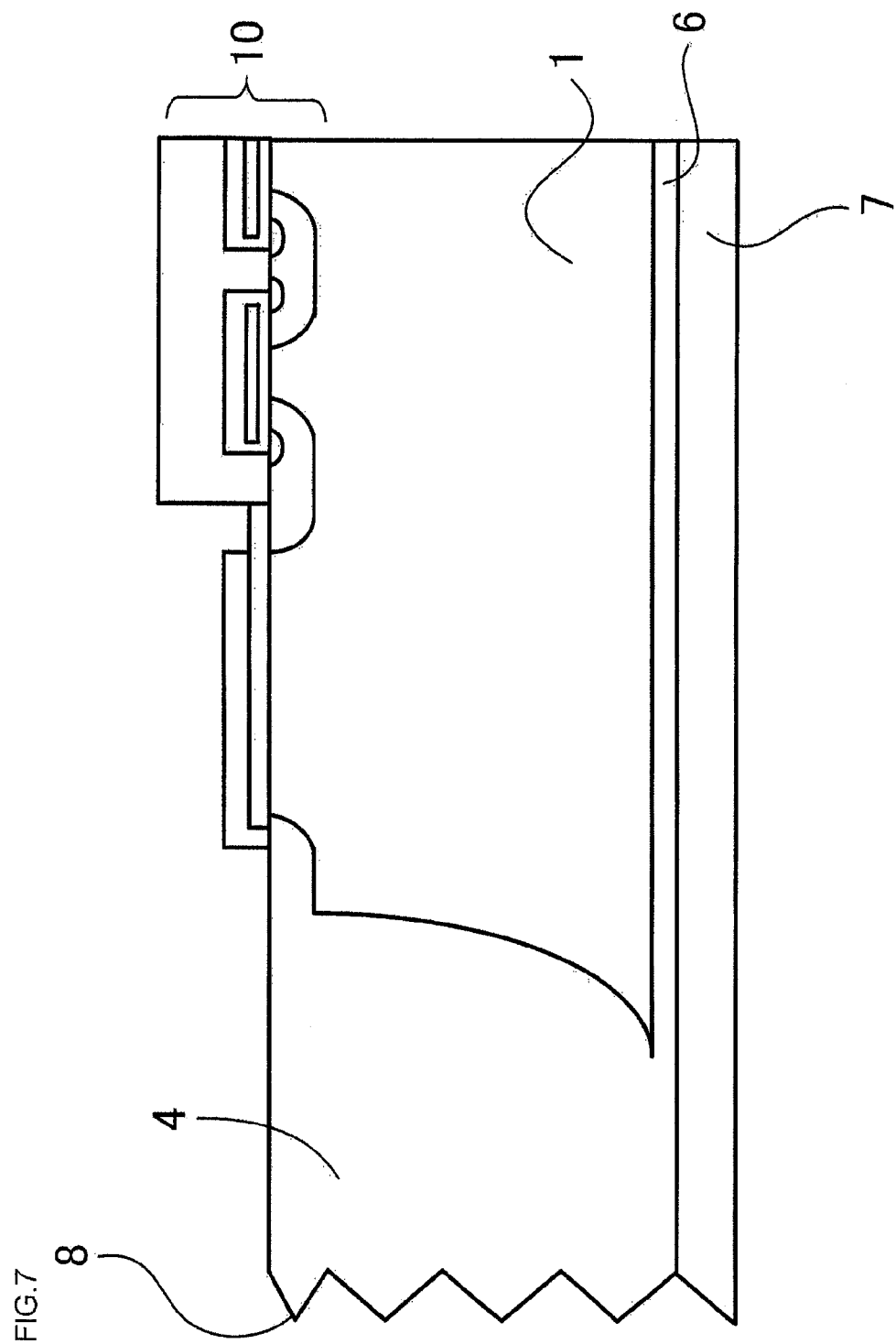
FIG. 7 is an enlarged sectional view of the end part of a reverse blocking IGBT manufactured by a conventional process for forming the isolation layer.
Figure 8A:
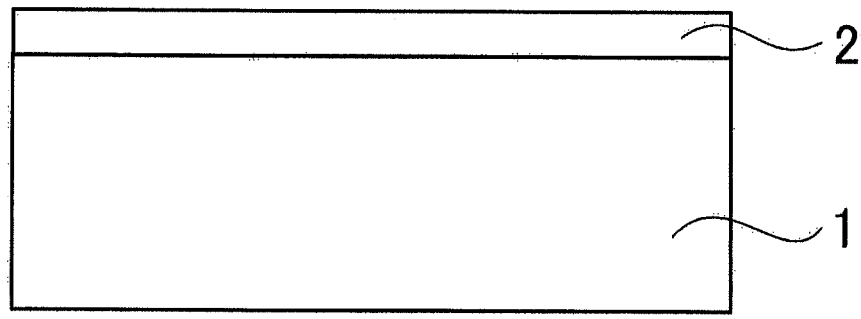
FIGS. 8A, 8B, and 8C are enlarged sectional views of the part around the isolation layer, showing a conventional process for forming the isolation layer using a trench.
Figure 8B:
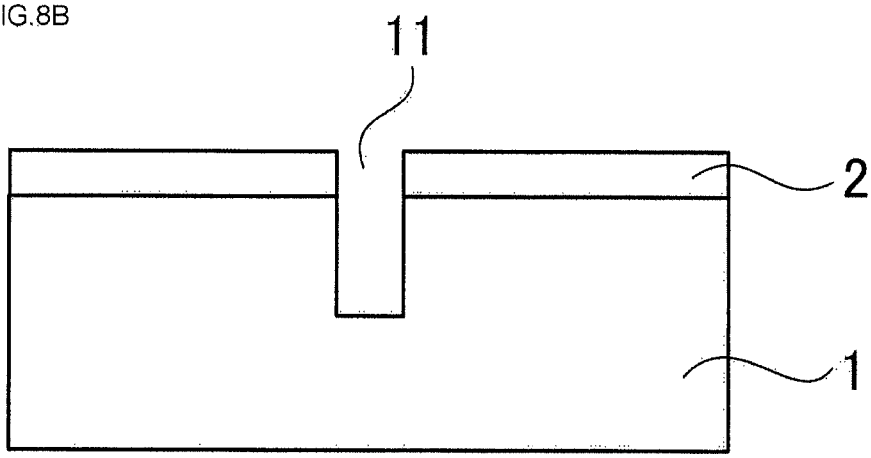
Figure 8C:
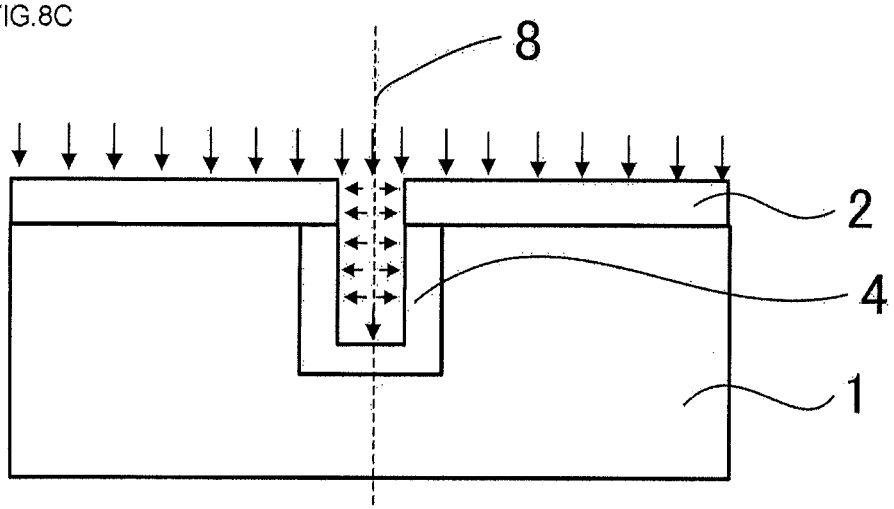
Figure 9:
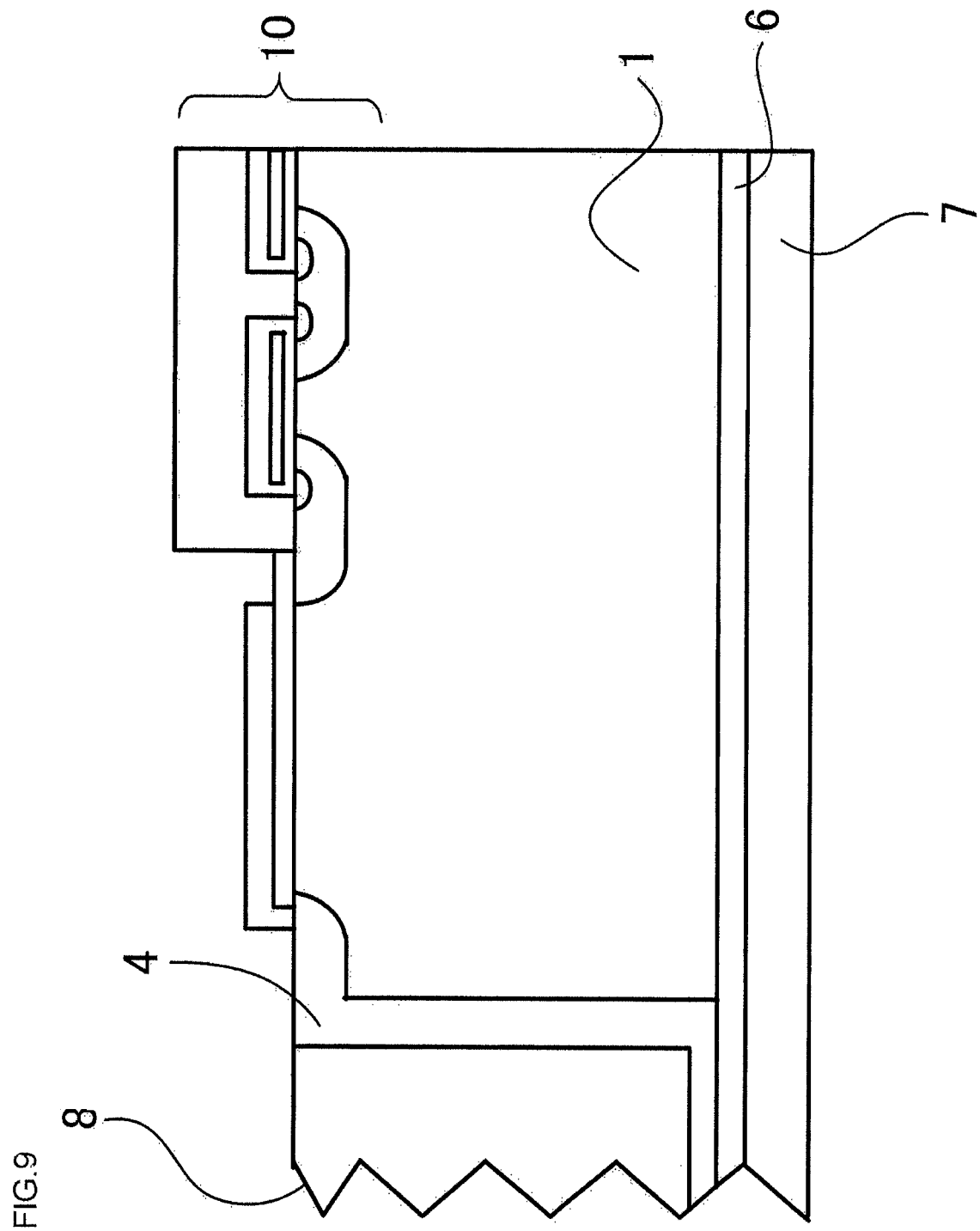
FIG. 9 is an enlarged sectional view of the end part of a reverse blocking IGBT with an isolation layer formed by a conventional process using a trench.

FIG. 5C is an enlarged sectional view of the fabricated reverse blocking IGBT chip including the end portion thereof.

The method of the embodiment of the invention does not require a deep p$^+$ isolation layer that must be formed by a thermal diffusion process at a high temperature for a long time. Therefore, the method not only shortens the process time, but also eliminates the risk of deteriorating processing equipment and semiconductor performance.

Since the side surface of the device chip is the tilted surface of the tapered groove formed by an alkali etching process, ion injection to the side wall surface can be readily carried out and stable distribution of impurity concentration is obtained. Ion injection processes are readily carried out in the separate processes for forming the p region of the isolation layer on the side wall surface and for forming the collector layer. Therefore, the p region of the isolation layer can be formed with an impurity concentration appropriate to ensure reverse breakdown voltage. The dose amount of the collector layer can be determined independently of that of the p region of the isolation layer and thus, can be set according to desired IGBT characteristics, and for example, at a relatively low impurity concentration with emphasis on reduction of loss or at a relatively high impurity concentration focusing on reduction of on-resistance.

A list and description of the references numerals and symbols used herein are as noted below:
- 1: semiconductor substrate
- 2: oxide film
- 3: opening
- 4: isolation layer
- 4a: $p^+$ diffusion layer (of the isolation layer 4)
- 4b: p region (of the isolation layer 4)
- 5: boron source
- 6: p collector layer
- 7: collector electrode
- 8: scribe line
- 10: MOS gate structure
- 11: trench
- 15: n emitter region
- 16: p base region
- 21: gate insulation film
- 22: polysilicon film, polysilicon electrode
- 23: interlayer dielectric film
- 24: emitter electrode While the present invention has been particularly shown and described with reference to the embodiments thereof, it will be understood by those skilled in the art that the foregoing and other changes in form and details can be made therein without departing from the spirit and scope of the present invention.

What is claimed is:

1. A method of manufacturing a reverse blocking insulated gate bipolar transistor comprising:
    forming a ring-shaped diffusion layer of a second conductivity type composing a part of an isolation layer in a region of a first principal surface side of a semiconductor substrate of a first conductivity type;
    forming a main front surface structure including a MOS gate structure region and a voltage withstanding structure region in a region surrounded by the ring-shaped diffusion layer of the first principal surface side region;
    forming a tapered groove with a depth at least reaching a bottom surface of the ring-shaped diffusion layer from a second principal surface opposing the ring-shaped diffusion layer;
    forming a second conductivity type region on a side wall surface of the tapered groove; and
    forming a collector layer of the second conductivity type on the second principal surface to connect the second principal surface to the first principal surface through the second conductivity region,
    the tapered groove being formed by an anisotropic alkali etching process leaving the semiconductor substrate with a thickness of at least 60 μm between the bottom of the tapered groove and the first principal surface.

2. The method of manufacturing a reverse blocking insulated gate bipolar transistor according to claim 1, wherein
    the first principal surface is a (100) plane and the side wall surface of the tapered groove is a {111} plane.

3. The method of manufacturing a reverse blocking insulated gate bipolar transistor according to claim 1, wherein
    forming the main front surface structure comprises:
        forming guard rings in the voltage withstanding structure region using a mask of an oxide film, formed anew after forming the ring-shaped diffusion layer of the second conductivity type;
        forming a polysilicon gate electrode to form the MOS gate structure inside the guard rings after processes of depositing a gate insulation film and a polysilicon film successively and removal of the polysilicon film on the second principal surface side; and
        depositing a metallic electrode interposing an interlayer dielectric film.

4. The method of manufacturing a reverse blocking insulated gate bipolar transistor according to claim 1, wherein
    the tapered groove is formed by the anisotropic alkali etching process using a mask of the oxide film that has been formed during formation of the main front surface structure.

5. The method of manufacturing a reverse blocking insulated gate bipolar transistor according to claim 1, wherein
    the second conductivity region is formed to form the isolation layer on the side wall surface of the tapered groove by an ion injection process using the mask of the oxide film that has been used for forming the tapered groove.

6. The method of manufacturing a reverse blocking insulated gate bipolar transistor according to claim 1, wherein
    a laser annealing process is conducted on the second conductivity region, formed on the side wall surface of the tapered groove by the ion injection process, to activate the second conductivity region and obtain the completed isolation layer.

7. The method of manufacturing a reverse blocking insulated gate bipolar transistor according to claim 6, wherein
    the collector layer of the second conductivity type is formed on the second principal surface after completing the isolation layer and removing the mask of the oxide film.

* * * * *